United States Patent [19]

Arai et al.

[11] Patent Number: 5,057,787
[45] Date of Patent: Oct. 15, 1991

[54] VARIABLE GAIN DIFFERENTIAL AMPLIFIER

[75] Inventors: Minoru Arai, Hachioji; Yukihiro Kato, Hino, both of Japan

[73] Assignee: Teac Corporation, Tokyo, Japan

[21] Appl. No.: 523,222

[22] Filed: May 14, 1990

[30] Foreign Application Priority Data

May 16, 1989 [JP] Japan ................................ 1-122047

[51] Int. Cl.⁵ .............................................. H03F 3/45
[52] U.S. Cl. ...................................... 330/254; 330/261
[58] Field of Search ................ 330/69, 252, 254, 261, 330/301

[56] References Cited

U.S. PATENT DOCUMENTS 3,689,752 9/1972 Gilbert ................................ 235/194
4,563,653 1/1986 Perahia ................................ 330/254
4,963,836 10/1990 Noguchi et al. ..................... 330/254

Primary Examiner—Steven Mottola
Attorney, Agent, or Firm—Woodcock Washburn Kurtz Mackiewicz & Norris

[57] ABSTRACT

A differential amplifier has at least two pairs of transistors functioning as current dividing circuits in addition to two other conventionally employed current dividing circuits in this type of amplifier. The signal current components flowing through the two additional current dividing circuits surffer no substantial distortions as do those flowing through the conventional current dividing circuits. The output current of the differential amplifier is a sum of these signal components. Accordingly, the less the proportion of the distorted signal components to the undistorted ones is, the freer the differential amplifier from waveform and high frequency distortion becomes.

5 Claims, 6 Drawing Sheets

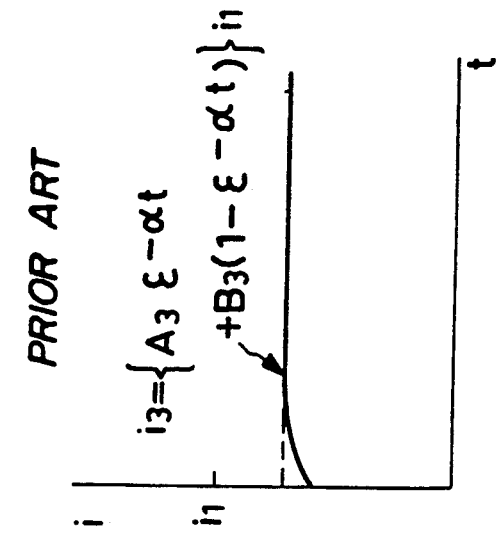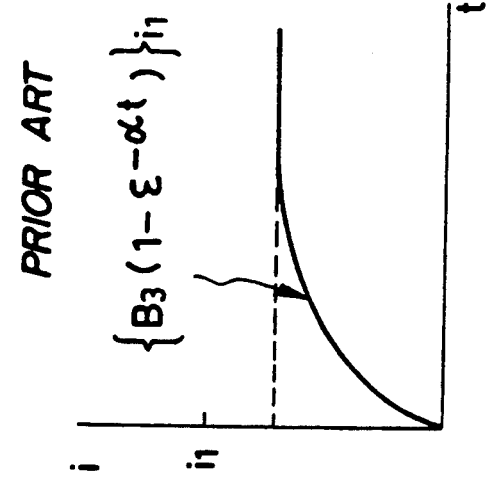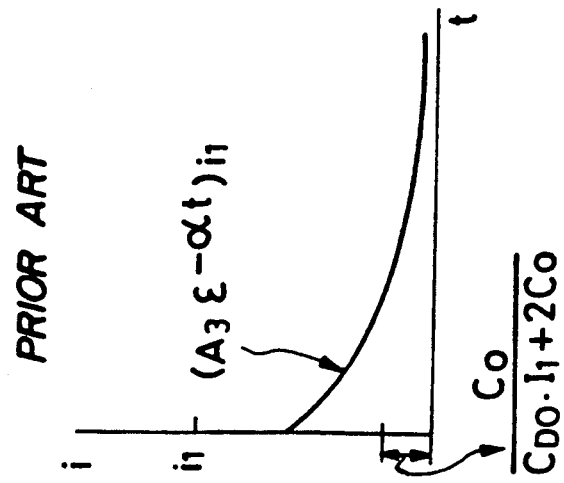
FIG.5A PRIOR ART
FIG.5B PRIOR ART
FIG.5C PRIOR ART

VARIABLE GAIN DIFFERENTIAL AMPLIFIER

BACKGROUND OF THE INVENTION

Our invention relates to amplifiers, and more particularly to differential amplifiers capable of producing an output proportional to the difference between two inputs. More particularly, our invention relates to a differential amplifier whose gain is variable at will.

Our invention represents an improvement over variable gain differential amplifiers disclosed by U.S. Pat. No. 3,689,752 to Gilbert. When the gain is varied, their high frequency response characteristics of the prior art amplifiers change so much that the signal waveform suffers great distortions. We will later explain how such signal distortions have occurred with the prior art, with reference to some of the drawings attached hereto.

SUMMARY OF THE INVENTION

We have hereby invented an amplifier which substantially reduces distortions in the high frequency response to the variable gain.

Briefly, our invention may be summarized as a variable gain differential amplifier comprising a pair of input terminals connected to the bases of a first pair transistors, the emitters of which are both connected to an electric current source. A pair of output terminals are connected to a supply terminal via a pair of load resistors, respectively. A second pair of transistors have their collectors connected to the supply terminal via the first and second load resistors, respectively, and their bases connected to a pair of gain control terminals, respectively. A third pair of transistors have their emitters connected to the emitters of the second pair of transistors, their collectors cross-connected to the collectors of the second pair of transistors, and their bases connected to the pair of gain control terminals. A fourth pair of transistors have their emitters connected to the collectors of the first pair of transistors, their collectors connected to the emitters of the second and third pairs of transistors, and their bases connected to a common bias terminal. Also included are two current dividing circuits connected respectively between the second and fourth pairs of transistors.

Preferably, each of the two current dividing circuits comprises an additional pair of transistors. In another preferred embodiment, each current dividing circuit additionally comprises three other transistors.

Because of the improved circuit configurations of the differential amplifier in our invention, the signal current components flowing through the two current dividing circuits suffer no substantial distortions, whereas the components flowing through the second and third pairs of transistors do. The output current of the differential amplifier is a sum of these signal components. Accordingly, the less the proportion of the distorted signal components becomes the freer the differential amplifier is from waveform distortion and the deterioration of its high frequency characteristic. Also, the range of variable gain may be made suitably narrower.

The above and other advantages of our invention and the manner of realizing them will become more apparent. The invention itself will best be understood, from a study of the following description and appended claims taken together with the attached drawings.

BRIEF DESCRIPTION OF THE DRAWINGS

FIGS. 4, 5 and 6, each consisting of (A)-(C), are a graphic representation of the step responses involved in the prior art differential amplifier of FIG. 1. The graph is explanatory of how signal distortions take place in the prior art;

DETAILED DESCRIPTION

Prior Art

Figure 1:
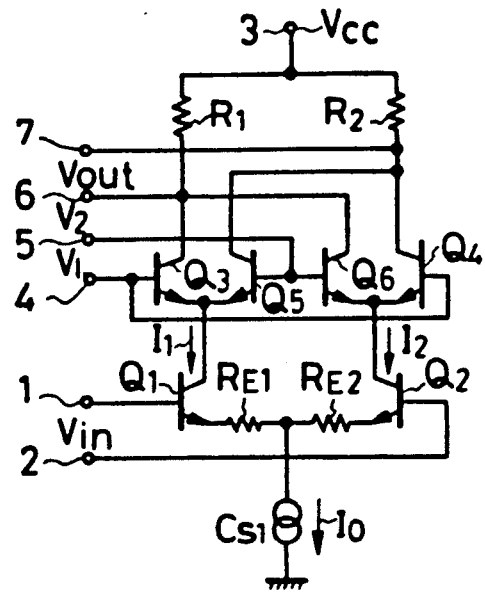
FIG. 1 is a diagram of a typical prior art variable gain differential amplifier bearing particular pertinence to our invention.

Referring to FIG. 1, the prior art differential amplifier circuit has a pair of transistors $Q_1$ and $Q_2$ having their emitters connected together via emitter resistors $R_{E1}$ and $R_{E2}$ to provide a differential amplifier. A constant current source $C_{S1}$ is connected between ground and the output from the transistors $Q_1$ and $Q_2$. The bases of the transistors $Q_1$ and $Q_2$ respectively are connected to input terminals 1 and 2 from which an input signal $V_{in}$ is to be supplied.

A second pair of transistors $Q_3$ and $Q_5$ has their emitters interconnected and further connected to the collector of the transistor $Q_1$ of the first recited pair of such transistors. A third pair of transistors $Q_4$ and $Q_6$ also has their emitters interconnected and further connected to the collector of the other transistor $Q_2$ of the first pair. The second and third pairs of transistors have their collectors respectively cross-connected to load resistors $R_2$ and $R_1$ and further to a supply terminal 3. A cascode amplifier is constituted of a serial connection of the grounded-emitter transistors $Q_1$ and $Q_2$ and the grounded-base transistors $Q_3$ and $Q_4$.

A first gain control terminal 4 is connected to the bases of the transistors $Q_3$ and $Q_4$. A second gain control terminal 5 is connected to the bases of the transistors $Q_5$ and $Q_6$. A pair of output terminals 6 and 7, at which an output signal $V_{out}$ is obtained, is connected to the collectors of the transistors $Q_3$ and $Q_4$.

The gain of this known differential amplifier circuit is variable through changes in the difference LV between the potential $V_1$ at the first gain control terminal 4 and the potential $V_2$ at the second gain control terminal 5. The change in the potential difference LV results in a change in the ratio at which the collector currents $I_1$ and $I_2$ of the transistors $Q_1$ and $Q_2$ are divided by the transistors $Q_3$ and $Q_4$, and the transistors $Q_5$ and $Q_6$. The gain may be varied continuously through continuous changes in the potential difference LV.

Figure 2:
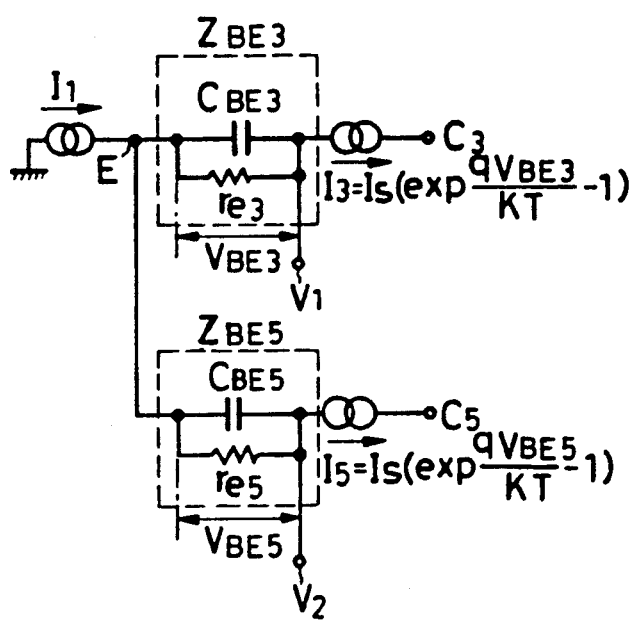
FIG. 2 is a circuit diagram equivalent to one pair of transistors included in the prior art differential amplifier of FIG. 1. The diagram is explanatory of the current dividing action of these transistors.

In FIG. 2 we have illustrated a simplified circuit of the current-dividing action of the transistors $Q_3$ and $Q_5$ of the prior art differential amplifier circuit of FIG. 1. The capital E in this diagram indicates the interconnection between the emitters of the transistors $Q_3$ and $Q_5$. As shown, connected to this interconnection E is a source of current $I_1$ equivalent to the collector current of the transistor $Q_1$ of the FIG. 1 circuit. The base-emitter impedance of the transistors $Q_3$ and $Q_5$ is respectively designated as $Z_{BE3}$ and $Z_{BE5}$; the emitter resistance of the transistors $Q_3$ and $Q_5$ is respectively designated as $r_{e3}$ and $r_{e5}$; and the base-emitter capacitance of the transistors $Q_3$ and $Q_5$ is respectively designated as $C_{BE3}$ and $C_{BE5}$.

Generally, the emitter resistance $r_e$ of the transistor is proportional to the reciprocal of the emitter current $I_E$. Thus, $$r_e = r_{eo} \cdot (1/I_E) \qquad (1)$$

where $r_{eo}$ is a constant.

The base-emitter capacitance $C_{BE}$ of the transistor is defined as:

$$C_{BE} = C_D + C_J + C_o \qquad (2)$$

where
$C_D$ = base diffusion capacitance,
$C_J$ = base-emitter junction capacitance,
$C_o$ = parasitic capacitance.

Being proportional to the emitter current $I_E$, the base diffusion capacitance $C_D$ is expressed as:

$$C_D = C_{Do} \cdot I_E \qquad (3)$$

where $C_{Do}$ is a constant.

The junction capacitance $D_J$ is negligibly small compared to the base diffusion capacitance $C_D$. The base-emitter impedance $Z_{BE}$ may therefore be considered as a parallel connection of the emitter resistance $r_e$ and the base-emitter capacitance $C_{BE}$. Thus, $$\begin{aligned} Z_{BE} &= r_e/(1 + jwr_eC_{BE}) \\ &= r_{eo} \cdot (1/I_E)/[1 + jwr_{eo} \cdot (1/I_E) \cdot (C_{Do} \cdot I_E + C_o)] \\ &= r_{eo} \cdot (1/I_E)/\{1 + jwr_{eo} \cdot [C_{Do} + C_o \cdot (1/I_E)]\}. \end{aligned} \qquad (4)$$

The signal current components $i_3$ and $i_5$ flowing through the transistors $Q_3$ and $Q_5$ can be expressed as:

$$i_3 = [Z_{BE5}/(Z_{BE3} + Z_{BE5})] \cdot i_1 \qquad (5)$$

$$i_5 = [Z_{BE3}/(Z_{BE3} + Z_{BE5})] \cdot i_1 \qquad (6)$$

where
$I_1$ = input signal current,
$I_{E3}$ = bias current of the transistor $Q_3$,
$I_{E5}$ = bias current of the transistor $Q_5$,
$Z_{BE3}$ = base-emitter impedance of the transistor $Q_3$,
$Z_{BE5}$ = base-emitter impedance of the transistor $Q_5$.

Figure 3:
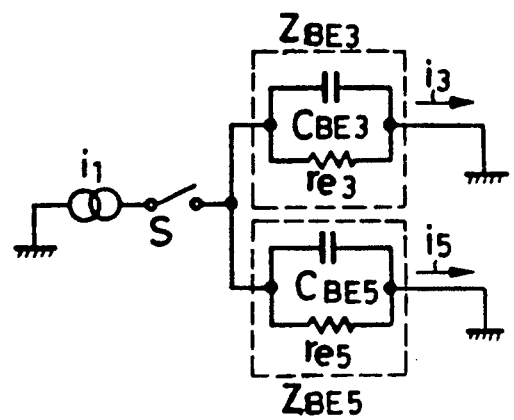
FIG. 3 is a circuit diagram equivalent to the same pair of transistors as in FIG. 2. The diagram is explanatory of the step response of the transistors.

The transient response characteristics, exhibited when the input current is supplied intermittently by the provision of a switch S as shown in FIG. 3, can be expressed as:

$$i_3(t) = \{[C_{BE3}/(C_{BE3} + C_{BE5})] \cdot \epsilon^{-\{(r_{e3}+r_{e5})/[r_{e3} \cdot r_{e5} \cdot (C_{BE3}+C_{BE5})]\}t} + \qquad (7)$$

$$[r_{e5}/(r_{e3} + r_{e5})] \cdot (1 - \epsilon^{-\{(r_{e3}+r_{e5})/[r_{e3} \cdot r_{e5} \cdot (C_{BE3}+C_{BE5})]\}t})\} i_1$$

$$i_5(t) = \{[C_{BE5}/(C_{BE3} + C_{BE5})] \cdot \epsilon^{-\{(r_{e3}+r_{e5})/[r_{e3} \cdot r_{e5} \cdot (C_{BE3}+C_{BE5})]\}t} + \qquad (8)$$

$$[r_{e3}/(r_{e3} + r_{e5})] \cdot (1 - \epsilon^{-\{(r_{e3}+r_{e5})/[r_{e3} \cdot r_{e5} \cdot (C_{BE3}+C_{BE5})]\}t})\} i_1.$$

Equations (7) and (8) can be rewritten from Equations (1) and (2) as:

$$\begin{aligned} i_3(t) &= \{[(C_{Do} \cdot I_{E3} + C_o)/(C_{Do} \cdot I_1 + 2C_o)] \cdot \\ & \quad \epsilon^{-\{I_1/[r_{eo} \cdot (C_{Do} \cdot I_1 + 2C_o)]\}t} + \\ & \quad (I_{E3}/I_1) \cdot (1 - \epsilon^{-\{I_1/[r_{eo} \cdot (C_{Do} \cdot I_1 + 2C_o)]\}t})\} i_1 \\ &= \{A_3 \cdot \epsilon^{-\alpha t} + B_3 \cdot (1 - \epsilon^{-\alpha t})\} i_1 \end{aligned} \qquad (9)$$

$$\begin{aligned} i_5(t) &= \{[(C_{Do} \cdot I_{E5} + C_o)/(C_{Do} \cdot I_1 + 2C_o)] \cdot \\ & \quad \epsilon^{-\{I_1/[r_{eo} \cdot (C_{Do} \cdot I_1 + 2C_o)]\}t} + \\ & \quad (I_{E3}/I_1) \cdot (1 - \epsilon^{-\{I_1/[r_{eo} \cdot (C_{Do} \cdot I_1 + 2C_o)]\}t})\} i_1 \\ &= \{A_5 \cdot \epsilon^{-\alpha t} + B_5 \cdot (1 - \epsilon^{-\alpha t})\} i_1 \end{aligned} \qquad (10)$$

where $A_3 = (C_{Do} \cdot I_{E3} + C_o)/(C_{Do} \cdot I_1 + 2C_o)$ $A_5 = (C_{Do} \cdot I_{E5} + C_o)/(C_{Do} \cdot I_1 + 2C_o)$ $B_3 = I_{E3}/I_1$ $B_5 = I_{E5}/I_1$ $\alpha = I_1/\{r_{eo} \cdot (C_{Do} \cdot I_1 + 2C_o)\}$.

Figure 4A:
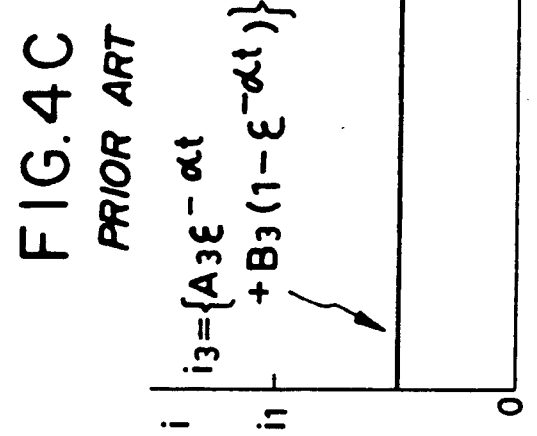
Figure 4B:
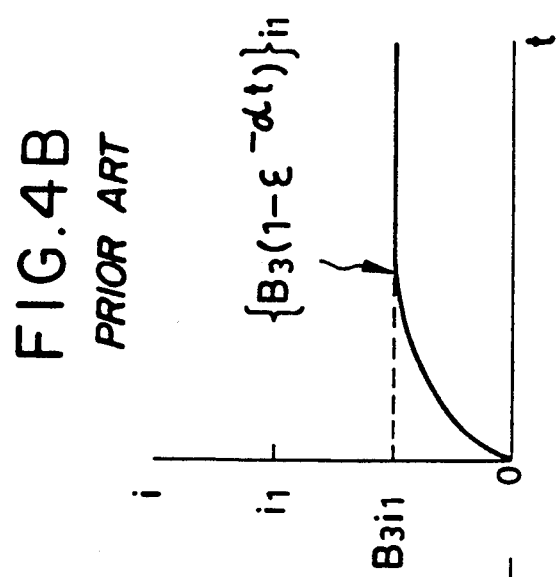
Figure 4C:
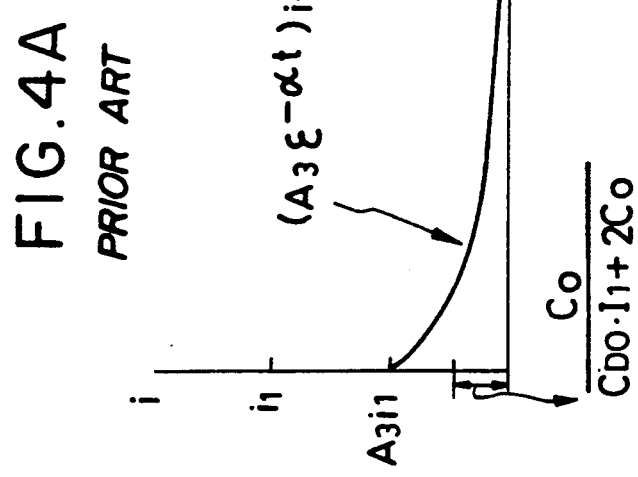
Figure 6C:
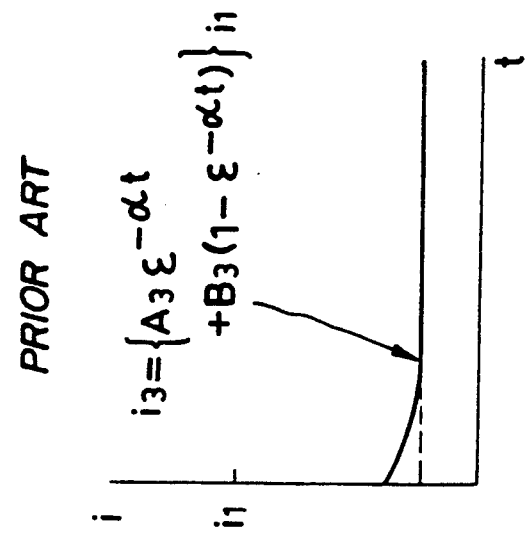
Figure 6B:
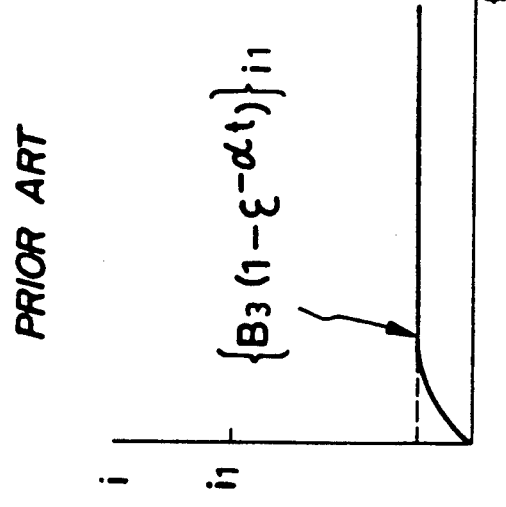
Figure 6A:
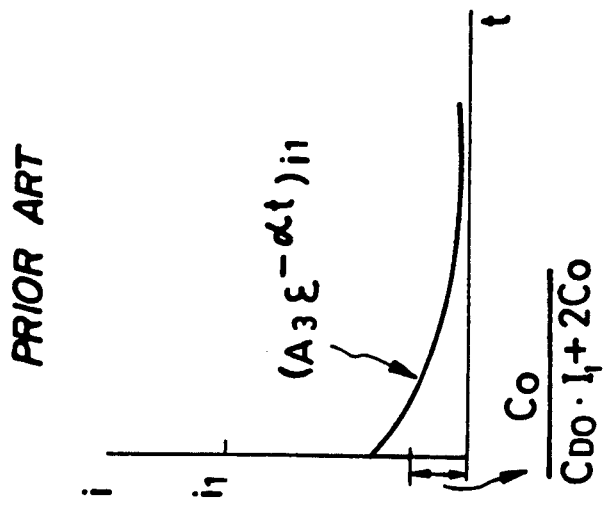

FIGS. 4-6 respectively show Equation (9) when $I_{E3} = I_{E5}$, $I_{E3} = 3 I_{E5}$ and $3 I_{E3} = I_{E5}$. In each figure, graphs (A)-(C) respectively represent the responses exhibited by the first term of the right hand side, the second term of the right hand side and the complete right hand side of Equation (9).

In the step response of the first term of the right hand side of Equation (9), the current i is $\{(C_{Do} \cdot I_{E3} + C_o)/C_{Do} \cdot I_1 \cdot 2C_o\} i_1$ when $t = 0$. This is composed of a component, $(C_{Do}/C_{Do} \cdot I_1 \cdot 2C_o)I_E \cdot I_1$, that is proportional to the emitter current $I_{E3}$, and a component, $\{C_o/(C_{Do} \cdot I_1 + 2C_o)\} i_1$, that is not. Let us assume that $C_{Do} \cdot I_E = C_o$ when $I_{E3} = I_{E5} = I_1/2$. With a change from $(I_{E3} = I_{E5} = I_1/2)$ to $(I_{E3} = \frac{3}{4} I_1)$ and $(I_{E5} = \frac{1}{4} I_1)$, the value of $A_3$ does not change increase in proportion to $I_{E3}$ but does in proportion to $(I_{E3}/I_1) \cdot i_1$ when $t = \infty$ in the step response of the second term of the right side of Equation (9).

The value of $B_3$ varies in proportion $I_{E3}$. Therefore, the step response of $I_3$ depicts the waveform that rises bluntly as in FIG. 5(C) when $I_{E3} = \frac{3}{4} I_1$ and $I_{E5} = \frac{1}{4} I_1$. When $I_{E3} = \frac{1}{4} I_1$ and $I_{E5} = \frac{3}{4} I_1$, on the other hand, it depicts the waveform that rises with an overshoot as in FIG. 6(C). These facts prove that the output signal waveform of the prior art circuit suffers distortions due to changes in the high frequency characteristic when the gain is changed by varying the current dividing ratio of the transistors $Q_3$ and $Q_5$.

This drawback of the FIG. 1 prior art circuit is totally absent from the improved differential amplifier of our invention.

First Preferred Embodiment

Figure 7:
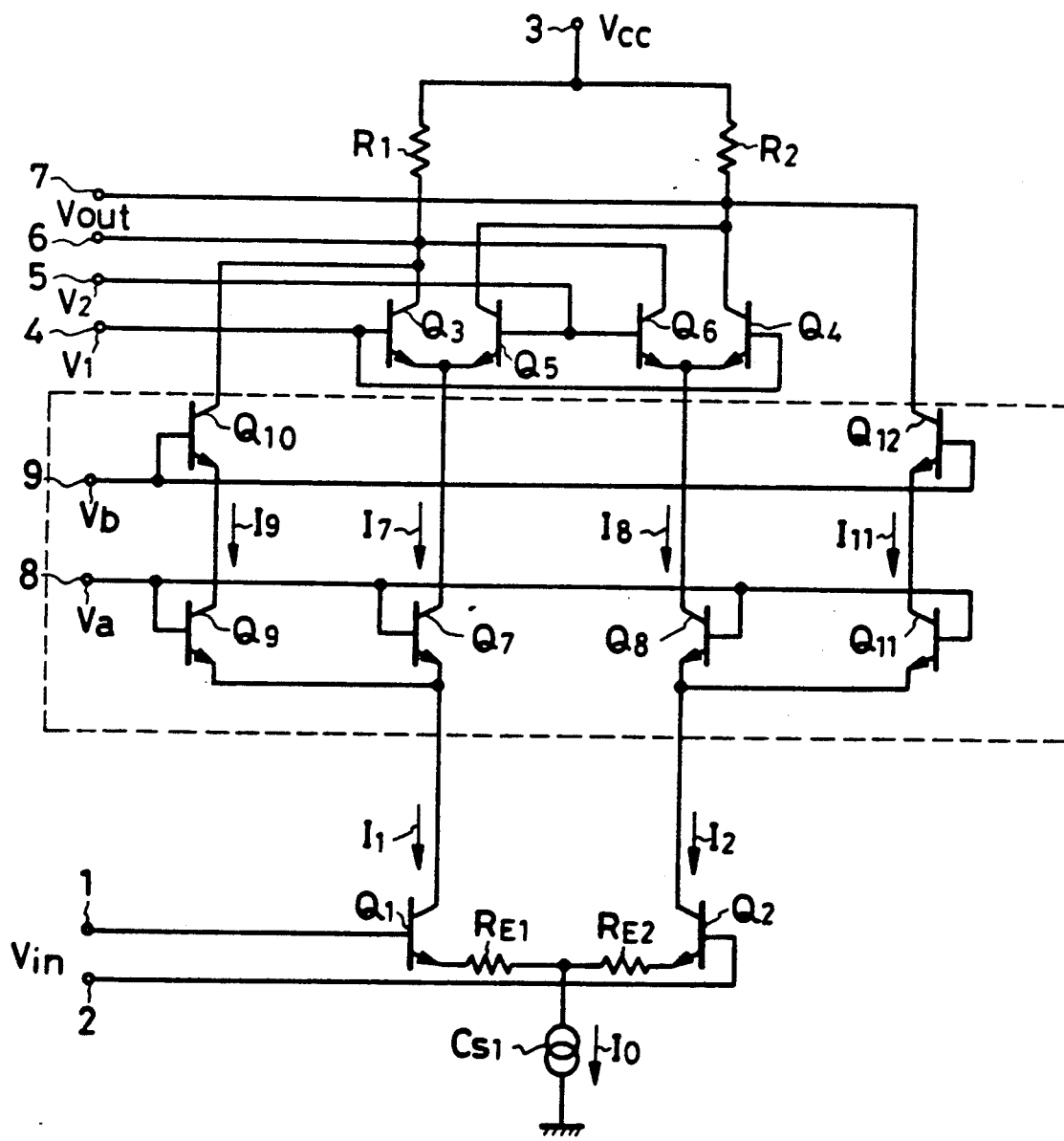
FIG. 7 is a diagram of a first preferred embodiment of a variable gain differential amplifier according to our invention.

FIG. 7 shows the first preferred embodiment of differential amplifier. The transistors $Q_1$–$Q_6$, load resistors $R_1$–$R_2$, emitter resistors $R_{E1}$ and $R_{E2}$, constant current source $C_{s1}$, input terminals 1 and 2, gain control terminals 4 and 5, and output terminals 6 and 7 perform substantially the same functions as their prior art counterparts designated by the same reference indicia in FIG. 1. The connections of these conventional parts are also substantially the same reference in FIG. 1. We will therefore omit any repeated description of such known parts.

The improved differential amplifier newly incorporates six additional transistors $Q_7$–$Q_{12}$ and bias terminals. These terminals are intended for the application of biasing potentials $V_a$ and $V_b$ to some selected transistors set forth hereafter.

The transistor $Q_7$ has its emitter connected to the collector of the transistor $Q_1$, its collector connected to the emitters of the transistors $Q_3$ and $Q_5$, and its base connected to the bias terminal 8. The transistor $Q_8$ has its emitter connected to the collector of the transistor $Q_2$, its collector connected to the emitters of the transistors $Q_4$ and $Q_6$, and its base connected to the bias terminal 8.

The transistors $Q_9$ and $Q_{10}$ form a first current dividing circuit. The transistors $Q_{11}$ and $Q_{12}$ form a second current dividing circuit. These two current dividing circuits constitute essential features of our invention.

The transistor $Q_9$ of the first current dividing circuit has its emitter connected to the emitter of the transistor $Q_7$, and its base connected to the bias terminal 8. The other transistor $Q_{10}$ of the first current dividing circuit has its emitter connected to the collector of the transistor $Q_9$, its collector connected to the collector of the transistor $Q_3$, and its base connected to the second bias terminal 9.

The transistor $Q_{11}$ of the second current dividing circuit has its emitter connected to the emitter of the transistor $Q_8$, and its base connected to the bias terminal 8. The other transistor $Q_{12}$ of the second current dividing circuit has its emitter connected to the collector of the transistor $Q_{11}$, and its collector connected to the collector of the transistor $Q_4$.

The transistors $Q_7$ and $Q_9$, and the transistors $Q_8$ and $Q_{11}$, both have their bases and emitters interconnected. Therefore, if these transistors are of the same characteristics, the collector currents $I_1$ and $I_2$ of the transistors $Q_1$ and $Q_2$ will be divided into two equal halves, and one half of each collector current will flow to the collector of the associated transistor. Thus, $$I_7 = I_9 = I_1/2 \quad (1)$$

$$I_8 = I_{11} = I_2/2 \quad (12)$$

where
$I_7$ = collector current of the transistor $Q_7$,
$I_8$ = collector current of the transistor $Q_8$,
$I_9$ = collector current of the transistor $Q_9$,
$I_{11}$ = collector current of the transistor $Q_{11}$.

As in the prior art circuit art of FIG. 1, the collector currents $I_7$ and $I_8$ of the transistors $Q_7$ and $Q_8$ respectively flow through the transistors $Q_3$ and $Q_5$ and the transistors $Q_4$ and $Q_5$. Inevitably, therefore, these collector currents invite deterioration in the high frequency response of the differential amplifier. However, the collector currents $I_9$ and $I_{11}$ of the transistors $Q_9$ and $Q_{11}$ do not flow through the transistors $Q_3$ and $Q_5$ and the transistors $Q_4$ and $Q_5$. These collector currents do not cause deterioration in high frequency response.

It will therefore be understood that in FIG. 7 under continuously variable gain the signal current is a sum of both deteriorated and nondeteriorated components in high frequency response. Consequently, the deterioration in the high frequency response according to our invention is half of that in the prior art.

Second Preferred Embodiment

Figure 8A:
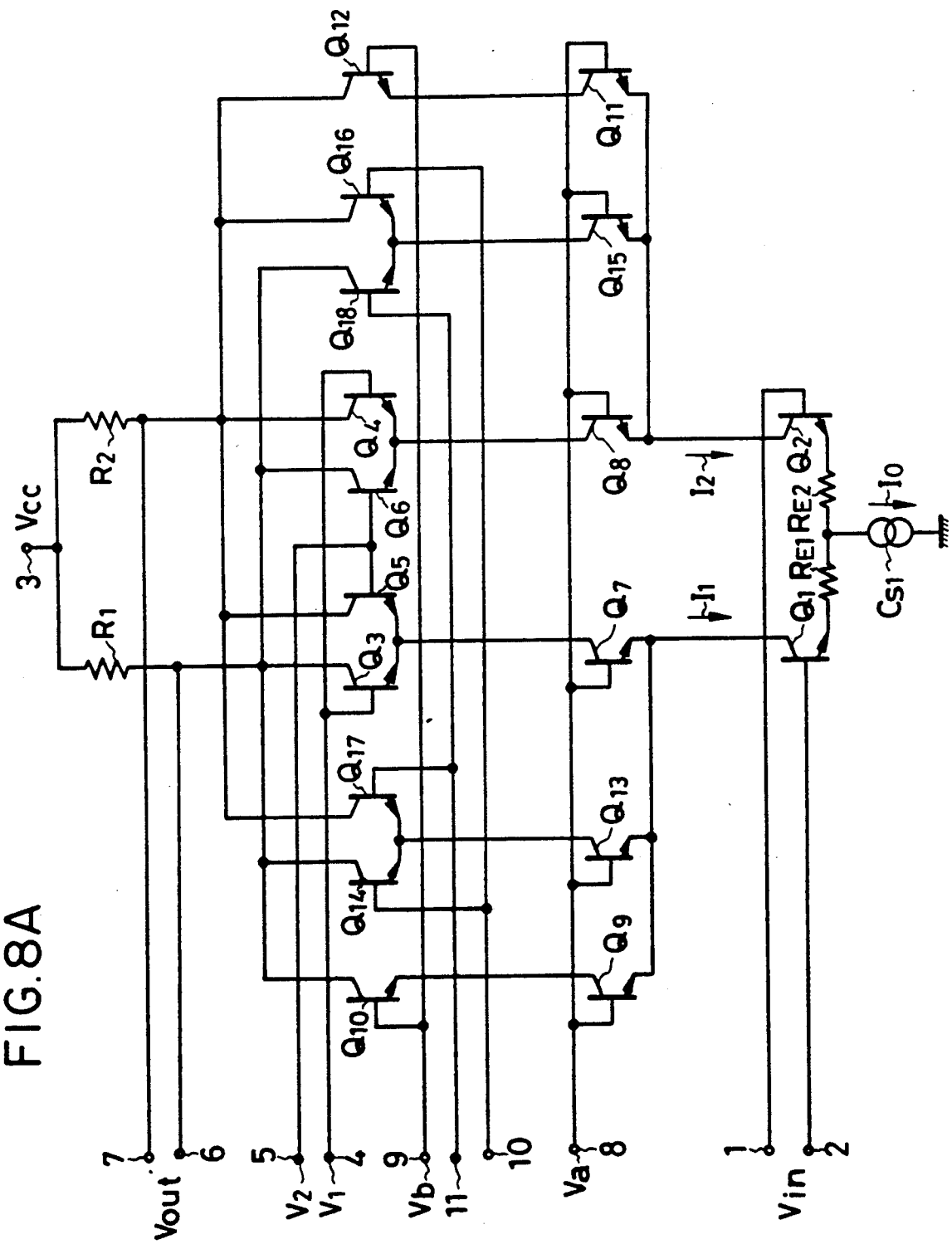
FIG. 8 is a similar diagram of a second preferred embodiment of variable gain differential amplifier according to our invention.

FIG. 8 shows a second preferred embodiment of differential amplifier according to our invention. It has six transistors $Q_{13}$–$Q_{18}$, in addition to the transistors $Q_1$–$Q_{12}$ of the FIG. 7 circuit, and two switching control terminals 10 and 11.

The transistor $Q_{13}$ has its emitter connected to the emitter of the transistor $Q_7$, its collector to the emitter of the transistor $Q_{14}$, and its base to the bias terminal 8. The transistor $Q_{14}$ has its collector connected to the collector of the transistor $Q_3$, and its base to the switching control terminal 10. The serial circuit of the transistors $Q_{13}$ and $Q_{14}$ is connected in parallel with the serial circuit of the transistors $Q_9$ and $Q_{10}$. Consequently, the transistors $Q_{13}$ and $Q_{14}$ constitute a current dividing circuit like the transistors $Q_9$ and $Q_{10}$.

The transistor $Q_{15}$ has its emitter connected to the emitter of the transistor $Q_8$, its collector connected to the emitter of the transistor $Q_{16}$, and its base connected to the bias terminal 8. The transistor $Q_{16}$ has its collector connected to the collector of the transistor $Q_4$, and its base connected to the switching control terminal 10. The serial circuit of the transistors $Q_{15}$ and $Q_{16}$ is connected in parallel with the serial circuit of the transistors $Q_{11}$ and $Q_{12}$. Therefore, like the latter serial circuit, transistors $Q_{15}$ and $Q_{16}$ in the serial circuit functions as a current dividing circuit, too.

The transistor $Q_{17}$ has its emitter connected to the collector of the transistor $Q_{13}$, its collector connected to the collector of the transistor $Q_4$, and its base connected to the switching control terminal 11. When the transistor $Q_{17}$ is conductive, it constitutes a current dividing circuit in combination with the transistor $Q_{13}$.

The transistor $Q_{18}$ has its emitter connected to the collector of the transistor $Q_{15}$, its collector connected to the collector of the transistor $Q_3$, and its base connected to the switching control terminal 11. When the transistor $Q_{18}$ is conductive, it constitutes a current dividing circuit in combination with the transistor $Q_{15}$.

The control terminal 10 is connected to the bases of the transistors $Q_{14}$ and $Q_{16}$ for their on-off control. The other switching control terminal 11 is connected to the bases of the transistors $Q_{17}$ and $Q_{18}$ for their on-off control.

In operation, let us assume that the transistors $Q_{14}$ and $Q_{16}$ are switched on, and the transistors $Q_{17}$ and $Q_{18}$ are switched off. Then, the collector current $I_1$ of the transistor $Q_1$ will be equally divided by the three transistors $Q_7$, $Q_9$ and $Q_{13}$. The collector current $I_2$ of the transistor $Q_2$ will also be equally divided by the three associated transistors $Q_8$, $Q_{11}$ and $Q_{15}$. Consequently, only one third of each of the collector currents $I_1$ and $I_2$ will respectively flow into transistors $Q_7$ and $Q_8$. The deterioration in this differential amplifier in the high frequency response is therefore only one third of that in the prior art.

It is also possible in the FIG. 8 circuit to make the transistors $Q_{17}$ and $Q_{18}$ conductive and the transistors $Q_{14}$ and $Q_{16}$ nonconductive.

Possible Modifications

Although we have shown and described our invention in very specific manners we do not wish our invention to be limited by the exact details of this disclosure. The following is a brief list of possible modifications or alterations of the illustrated embodiments which we believe all fall within the scope of our invention:

1. There may be provided a greater number of current dividing circuits than those included in the FIG. 8 circuit.

2. Switches may be connected to some or all of such a greater number of current dividing circuits, and 1/n of the total current may be varied continuously by providing n current dividing circuits, in order to reduce the high frequency response deterioration of the resulting amplifier to 1/n.

3. Either of the potentials $V_1$ and $V_2$ of the gain control terminals 4 and 5 may be made invariable.

What we claim is:

1. A variable gain differential amplifier comprising:
   (a) a first (1) and a second (2) input terminal;
   (b) a first transistor ($Q_1$) having a base connected to the first input terminal;
   (c) a second transistor ($Q_2$) having a base connected to the second input terminal;
   (d) a source ($C_{s1}$) of electric current connected to emitters of both first and second transistors;
   (e) a supply terminal (3);
   (f) a first (6) and a second (7) output terminal;
   (g) a first load resistor ($R_1$) connected between the supply terminal; and the first output terminal;
   (h) a second load resistor ($R_2$) connected between the supply terminal and the second output terminal;
   (i) a first (4) and a second (5) gain control terminal;
   (j) a third transistor ($Q_3$) having a collector connected to the supply terminal via the first load resistor, and a base connected to the first gain control terminal;
   (k) a fourth transistor ($Q_4$) having a collector connected to the supply terminal via the second load resistor, and a base connected to the first gain control terminal;
   (l) a fifth transistor ($Q_5$) having an emitter connected to an emitter of the third transistor, a collector connected to the collector of the fourth transistor, and a base connected to the second gain control terminal;
   (m) a sixth transistor ($Q_6$) having an emitter connected to an emitter of the fourth transistor, a collector connected to the collector of the third transistor, and a base connected to the second gain control terminal;
   (n) a bias terminal (8) for inputting a bias voltage;
   (o) a seventh transistor ($Q_7$) having an emitter connected to a collector of the first transistor, a collector connected to the emitters of the third and fifth transistors, and a base connected to the bias terminal;
   (p) an eighth transistor ($Q_8$) having an emitter connected to a collector of the second transistor, a collector connected to the emitters of the fourth and sixth transistors, and a base connected to the bias terminal;
   (q) a first current dividing circuit connected between the emitter of the seventh transistor and the collector of the third transistor; and
   (r) a second current dividing circuit connected between the emitter of the eighth transistor and the collector of the fourth transistor.

2. The variable gain differential amplifier of claim 1 further comprising:
   (a) a first resistor ($R_{E1}$) connected between the emitter of the first transistor and the current source; and
   (b) a second resistor ($R_{E2}$) connected between the emitter of the second transistor and the current source.

3. The variable gain differential amplifier of claim 1 wherein the first current dividing circuit comprises:
   (a) a ninth transistor ($Q_9$) having an emitter connected to the emitter of the seventh transistor, and a base connected to the bias terminal;
   (b) a second bias terminal (9); and
   (c) a tenth transistor ($Q_{10}$) having an emitter connected to a collector of the ninth transistor, a collector connected to the collector of the third transistor, and a base connected to the second bias terminal.

4. The variable gain differential amplifier of claim 3 wherein the second current dividing circuit comprises:
   (a) an eleventh transistor ($Q_{11}$) having an emitter connected to the emitter of the eighth transistor, and a base connected to the first recited bias terminal; and
   (b) a twelfth transistor ($Q_{12}$) having an emitter connected to a collector of the eleventh transistor, a collector connected to the collector of the fourth transistor, and a base connected to the second bias terminal.

5. The variable gain differential amplifier 4 further comprising:
   (a) a thirteenth transistor ($Q_{13}$) having an emitter connected to the emitter of the seventh transistor, and a base connected to the first bias terminal;
   (b) a fourteenth transistor ($Q_{14}$) having an emitter connected to a collector of the thirteenth transistor, and a collector connected to the collector of the third transistor;
   (c) a fifteenth transistor ($Q_{15}$) having an emitter connected to the emitter of the eighth transistor, and a base connected to the first bias terminal;
   (d) a sixteenth transistor ($Q_{16}$) having an emitter connected to a collector of the fifteenth transistor, and a collector connected to the collector of the fourth transistor;
   (e) a seventeenth transistor ($Q_{17}$) having an emitter connected to the collector of the thirteenth transistor, and a collector connected to the collector of the fourth transistor;
   (f) an eighteenth transistor ($Q_{18}$) having an emitter connected to the collector of the fifteenth transistor, and a collector connected to the collector of the third transistor;
   (g) a first switching control terminal (10) connected to bases of the fourteenth and sixteenth transistors; and
   (h) a second switching control circuit (11) connected to bases of the seventeenth and eighteenth transistors.

* * * * *

UNITED STATES PATENT AND TRADEMARK OFFICE
CERTIFICATE OF CORRECTION

PATENT NO. : 5,057,787
DATED : October 15, 1991
INVENTOR(S) : Minoru Arai et al

It is certified that error appears in the above-indentified patent and that said Letters Patent is hereby corrected as shown below:

In the Abstract, line 6, delete "surffer" and insert —suffer—.

Signed and Sealed this

Eleventh Day of April, 1995

Attest:

BRUCE LEHMAN

Attesting Officer     Commissioner of Patents and Trademarks